(12) United States Patent
Tseng et al.

(10) Patent No.: US 6,489,174 B1
(45) Date of Patent: Dec. 3, 2002

(54) METHOD OF FABRICATING ORGANIC LIGHT EMITTING DIODE

(75) Inventors: Chiu-Fen Tseng, Hsin-Cheng Hsiang (TW); Lai-Cheng Chen, Taipei (TW); Chih-Chiang Huang, Taoyuan Hsien (TW); Mao-Cheng Weng, Taoyuan Hsien (TW)

(73) Assignee: Delta Optoelectronics, Inc., Hsinchu (TW)

( * ) Notice: Subject to any disclaimer, the term of this patent is extended or adjusted under 35 U.S.C. 154(b) by 0 days.

(21) Appl. No.: 10/020,810

(22) Filed: Oct. 30, 2001

(30) Foreign Application Priority Data

Jul. 5, 2001 (TW) .................................... 090116427 A

(51) Int. Cl.[7] .............................................. H01L 21/00
(52) U.S. Cl. .......................................... 438/29; 438/99
(58) Field of Search ...................................... 438/29, 99

(56) References Cited

U.S. PATENT DOCUMENTS 6,087,196 A * 7/2000 Sturm et al. ................ 427/466
6,430,325 B1 * 8/2002 Shimoda ..................... 385/11

* cited by examiner

Primary Examiner—David Nelms
Assistant Examiner—Tu-Tu Ho
(74) Attorney, Agent, or Firm—J. C. Patents

(57) ABSTRACT

A method of fabricating an organic light emitting diode. A fluid is sprayed from a nozzle to dissolve organic material or a water-soluble material to be removed from a multi-layer structure of organic luminescent layer, hole transport layer, hole injection layer, electron transport layer and electron injection layer on a substrate. Using an air venting or pumping system such as a vacuum system, the dissolved organic or water-soluble material is removed. The multi-layer structure of organic luminescent layer, hole transport layer, hole injection layer, electron transport layer and electron injection layer can be patterned. After patterning, a step of encapsulation is performed. Thereby, the multi-layer structure is wrapped insulated from oxygen and water. The possibility for the cathode to react with oxygen or water molecules is reduced, and the device lifetime is effectively increased.

21 Claims, 6 Drawing Sheets

METHOD OF FABRICATING ORGANIC LIGHT EMITTING DIODE

CROSS-REFERENCE TO RELATED APPLICATION

This application claims the priority benefit of Taiwan application serial no. 90116427, filed Jul. 5, 2001.

BACKGROUND OF THE INVENTION

1. Field of the Invention

The invention relates in general to a method of fabricating an organic light emitting diode (OLED), and more particularly, to a method of using sprayed fluid to dissolve the organic material or water soluble material, and using a venting system such as a vacuum system to absorb the dissolved organic or water soluble material to pattern the organic material or the water soluble material.

2. Description of the Related Art

The organic light emitting diode includes an organic thin film with luminescence property sandwiched between two electrodes. While applying a voltage between 2 Volts to 10 Volts, holes are injected from anode and electrons are injected from cathode to the luminescent organic thin film. The potential generated by the external electric field causes the carriers to move and recombine within the thin film. A part of energy released by the recombination of the electron and hole pairs excites the luminescent molecules to single-excited-state molecules. When the single-excited-state molecules fall back to the ground state, a certain proportion of the energy is released in a form of photons to generate luminescence. This is the luminescence mechanism for the organic light emitting diode. Typically, the model of mobile charges is the energy band model. However, different from metal or semiconductor material having certain band width, the energy band of organic material is referred as the continuous energy band formed by electrons and holes. Applying such a model, the process of the photons being released by recombination in the energy band gap after injecting charges from electrodes is easily introduced.

FIG. 1 shows a flow chart of a method for fabricating a conventional organic light emitting diode. A transparent substrate is provided. Multiple strip like anodes are formed on the transparent substrate in step S100. The material of the anodes includes indium tin oxide (ITO). A global coating process is performed to form a multi-layer structure made up of an organic luminescence layer, hole transport layer, hole injection layer, electron transport layer and electron injection layer in step S102. Since the multi-layer structure of the organic light emitting diode has the property of easily absorbing moisture, a pattern process is required before encapsulating the multi-layer structure (S104). The pattern process includes removing a part of the multi-layer structure between the light emitting diodes, so as to define the light emitting diodes on the substrate. The multi-layer structure with the hydrophilic property is then wrapped with the encapsulation material. The penetration of water and oxygen molecules that affect the electric performance of the device is thus prevented.

Further referring to FIG. 1, a plurality of strip like cathodes are formed on the luminescent layer in step S106. The organic light emitting diode array is thus formed. After completion of the organic light emitting diode array, an encapsulation process is performed in step S108, followed by a die cutting step as denoted as S110 to cut the substrate into a plurality of organic light emitting diodes.

In step S104, the conventional method of removing the multi-layer structure includes using a tool such as cotton to wipe the edge of the transparent substrate, or using a laser to wipe the edge, so as to remove the unwanted multi-layer structure on the edge of the organic light emitting diodes. Alternatively, a mask process is performed on the substrate to form the patterned organic luminescent layer and hole transport layer.

Drawbacks exist for the manual or laser edge wiping and the mask process. The manual edge wiping consumes great labor and cost, so that a mass production cannot be achieved. The laser edge wiping and the mask process have the problem of high fabrication cost.

SUMMARY OF THE INVENTION

The invention uses a nozzle to spray a fluid that dissolves the organic or water-soluble material to be removed from the multi-layer structure made up of the organic luminescent layer, hole transport layer, hole injection layer, electron transport layer, and electron injection layer. The dissolved material is then vented or vacuumed away. The patterning of the multi-layer structure can thus be obtained. After patterning, an encapsulation step is performed to wrap the multi-layer structure made up of an organic luminescent layer, hole transport layer, hole injection layer, electron transport layer, and electron injection layer to isolate the oxygen and water molecules. The probability for the cathode to react with oxygen and water molecules is reduced, and the lifetime of the device is effectively increased.

The material to be removed with the fluid sprayed from the nozzle is not limited to organic luminescent layer, hole transport layer, hole injection layer, electron transport layer, and electron injection layer. The fluid sprayed from the nozzle can also be applied to remove other organic or water-soluble material.

Both the foregoing general description and the following detailed description are exemplary and explanatory only and are not restrictive of the invention, as claimed.

DESCRIPTION OF THE PREFERRED EMBODIMENTS

The conventional method of removing the multi-layer structure made up of an organic luminescent layer, hole transport layer, hole injection layer, electron transport layer, and electron injection layer includes using a tool to wipe the edges of a transparent substrate. Alternatively, a laser edge wiping or a mask process can also be applied. In this invention, a fluid sprayed from a nozzle is used to dissolve the organic luminescent layer and the hole transport layer, which are then vented or vacuumed away to achieve the pattern process performed thereon.

Figure 1:
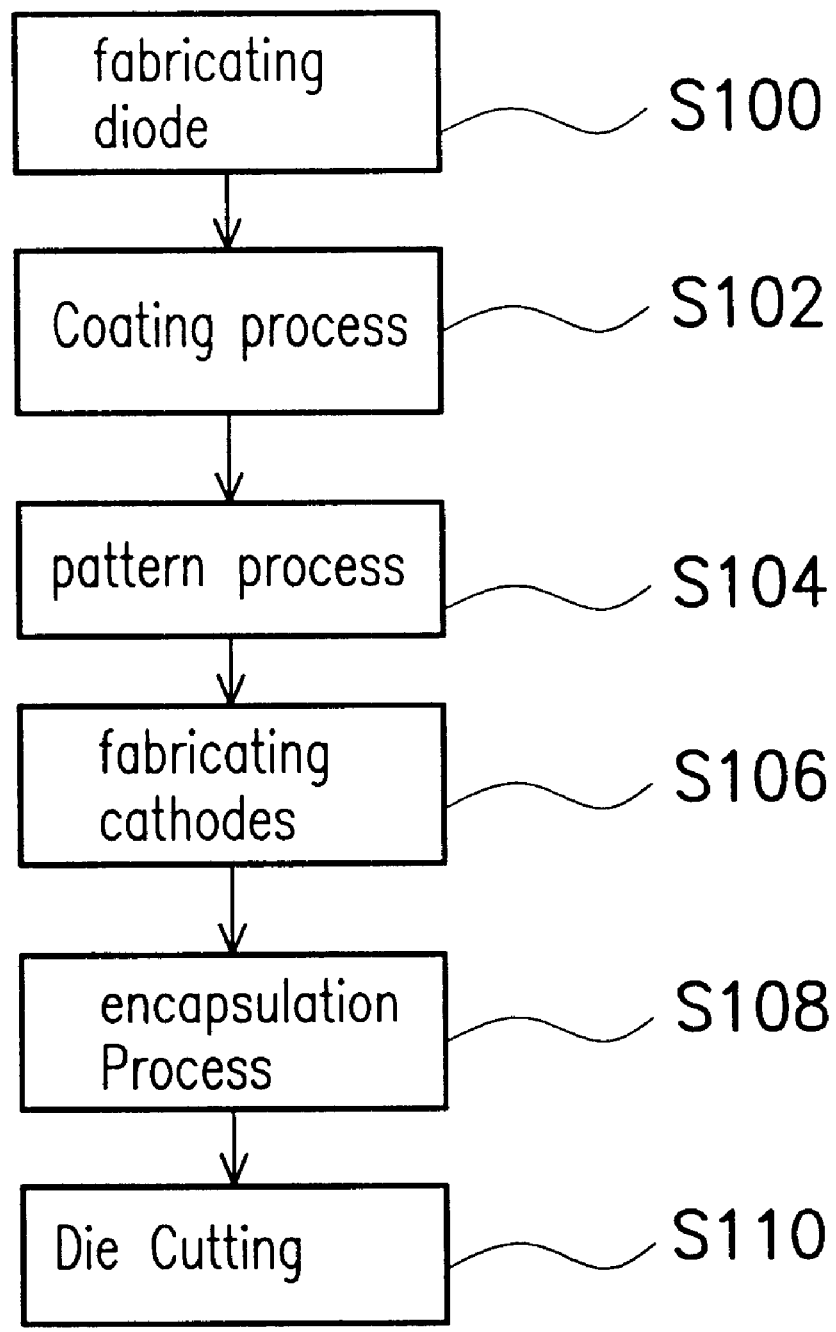
FIG. 1 shows a conventional process for forming an organic light emitting diode.
Figure 2:
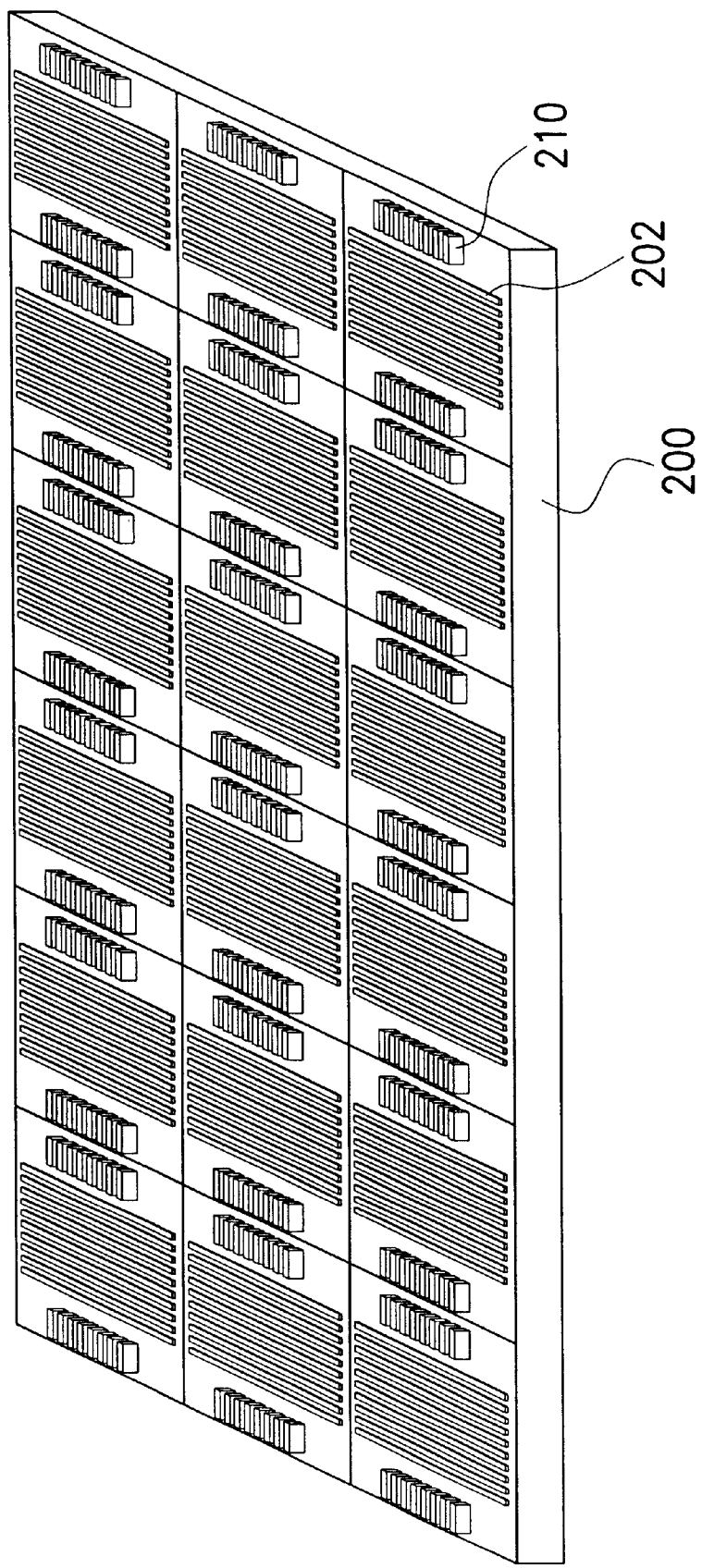
FIGS. 2–6 shows the process of fabricating an organic light emitting diode in one embodiment of the invention.

FIGS. 2–6 illustrate an embodiment of fabricating an organic light emitting diode according to the invention. In FIG. 2, a transparent substrate 200, for example, a glass substrate, is provided. An anode 202 is formed on the transparent substrate 200. The method of forming the anode 202 includes sputtering an ITO layer on the transparent substrate 200, followed by a pattern process performed on the ITO layer to form the anode 202 with multiple strips. In addition, an electrode lead 210 (as shown in FIG. 2) may be optionally formed on the transparent substrate 200. The method for forming the electrode lead 210 includes sputtering and patterning an ITO layer.

The above anode 202 may also be a conductive circuit being patterned directly to meet the requirement of different products. The anode 202 does not have to be arranged as multiple strips.

Figure 3:
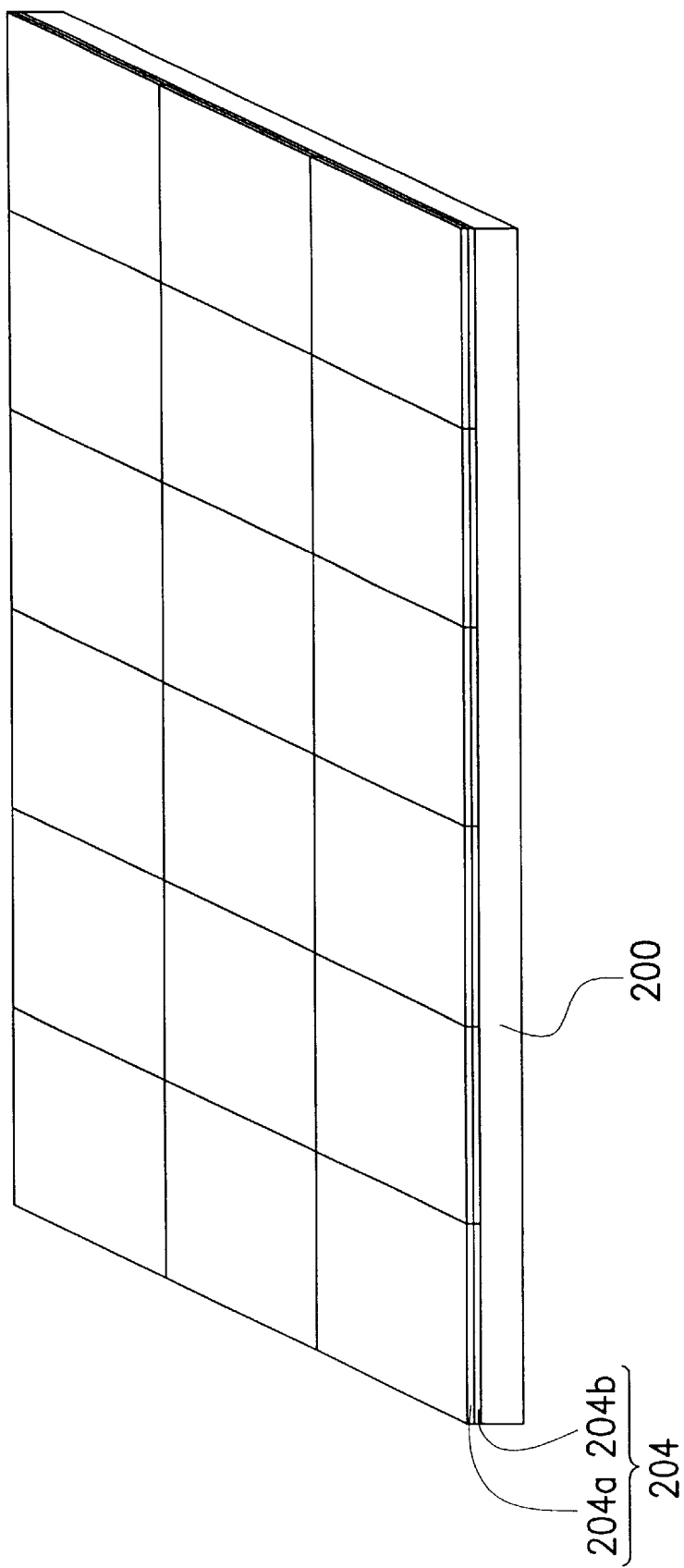

In FIG. 3, a hole transport layer 204a and an organic luminescent layer 204b are formed on the transparent substrate 204 globally. The hole transport layer 204a and the organic luminescent layer 204b can be formed by spin on coating. The material for forming the organic luminescent layer 204b includes PA, Pan, PPP or PPV. In addition to the hole transport layer 204a and the organic luminescent layer 204b, layers including the hole injection layer (HIL), electron transport layer (ETL), and electron injection layer (EIL) may also be formed on the transparent substrate 200. The embodiment uses formation of the organic luminescent layer 204b and the hole transport layer 204a as an example without limiting the scope.

Figure 4:
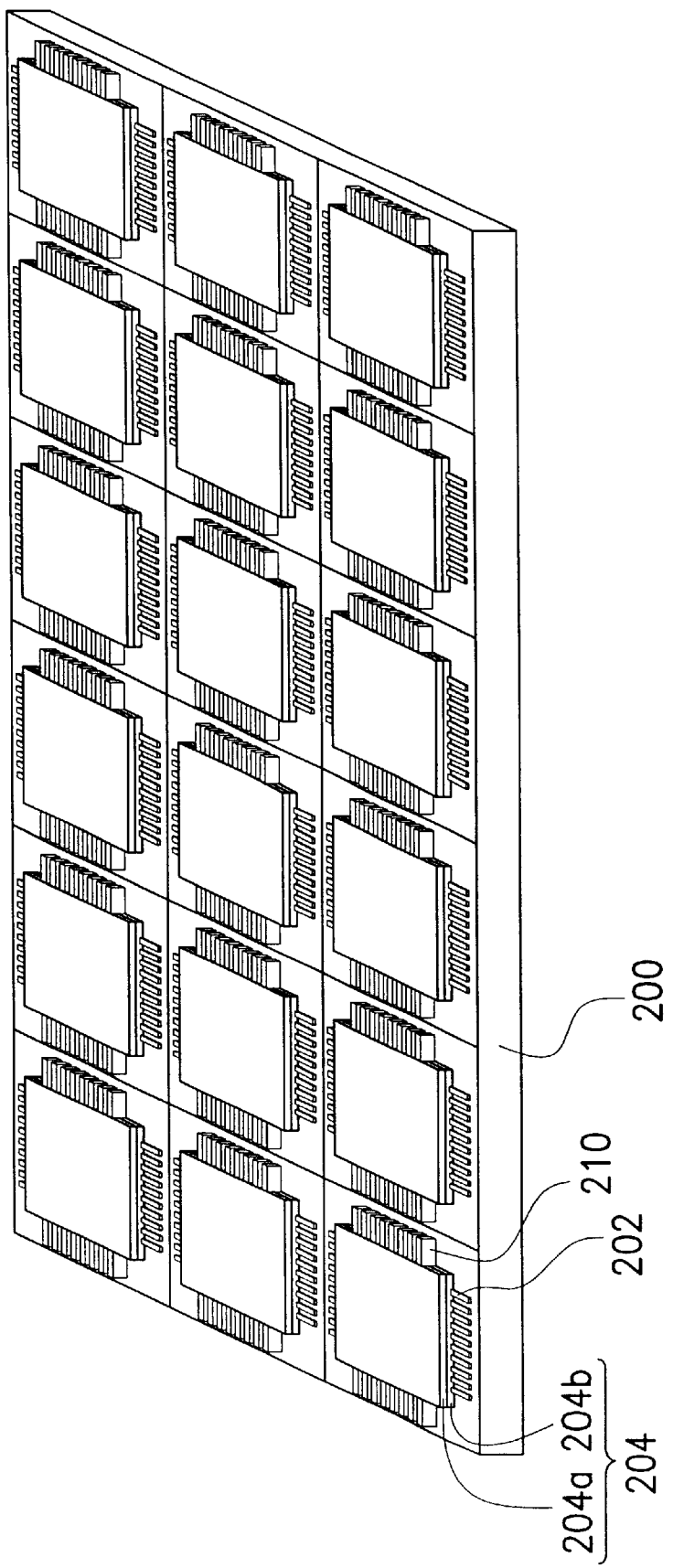

In FIG. 4, a portion of the hole transport layer 204a and the organic luminescent layer 204b is removed to expose the anode 202 and the electrode 210. The removing method includes spraying a fluid from a nozzle by applying a pressure thereto. The fluid is selected so that both the hole transport layer 204a and the organic luminescent layer 204b are soluble thereto. By the mechanical force of the fluid, the hole transport layer 204a and the organic luminescent layer 204b are patterned. Thereby, the automatic mass production can be applied, and the fabrication cost is reduced.

The above embodiment uses the hole transport layer 204a and the organic luminescent layer 204b as an example. However, in addition to these two layers, a hole injection layer, electron transport layer, and electron injection layer made of organic or water-soluble material can also be formed between the anode and cathode according to the specific requirement. The removal method of these additional layers also includes spraying fluid from the nozzle. Further, the removal method can be applied to any position on the substrate in addition to the organic luminescent layer, hole transport layer, hole injection layer, electron transport layer, and electron injection layer.

Figure 5:
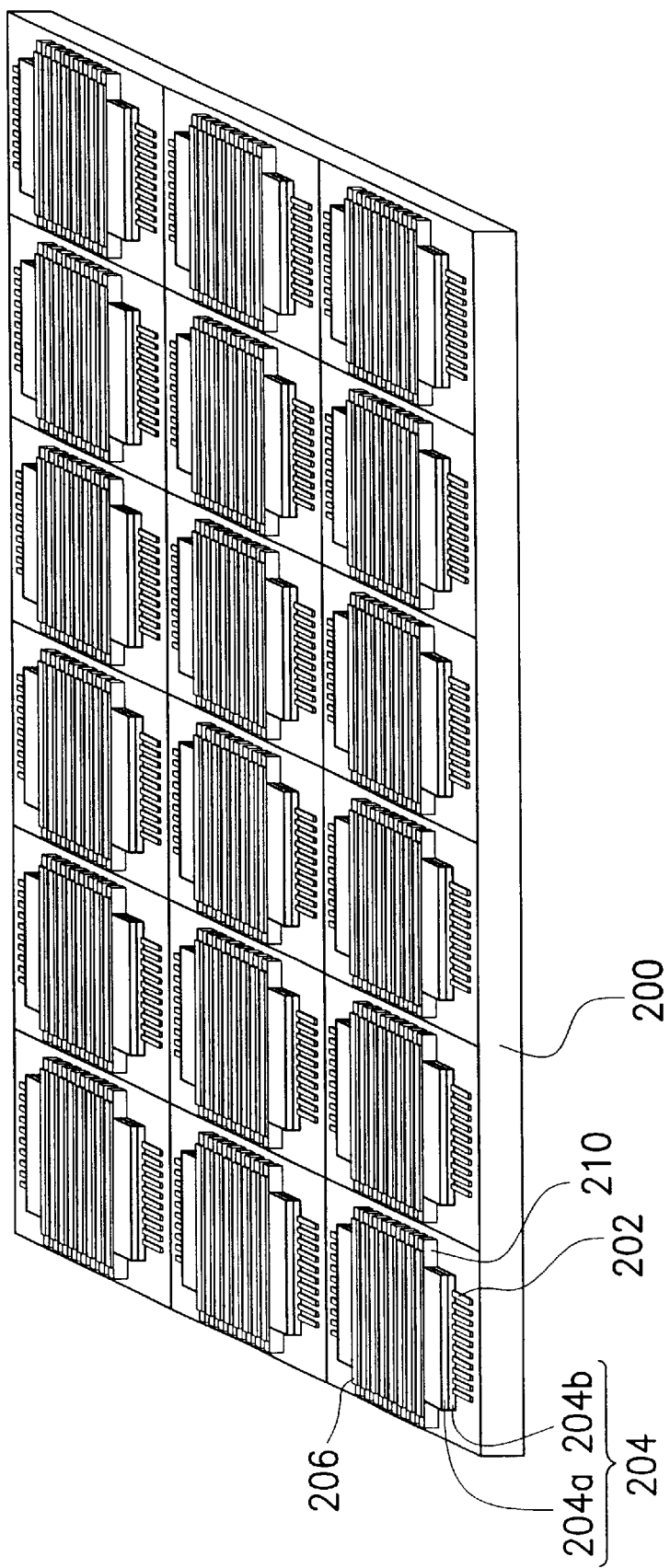

In FIG. 5, a cathode 206 is formed after patterning. The method of forming the cathode 206 includes sputtering or depositing a metal layer, which is then patterned into multiple strips of cathode 206. The cathode 206 crosses over the organic luminescent layer 204b and has two ends electrically connecting to the electrode lead 210. In addition, the pattern of the cathode 206 is not restricted to be multiple strips only.

Figure 6:
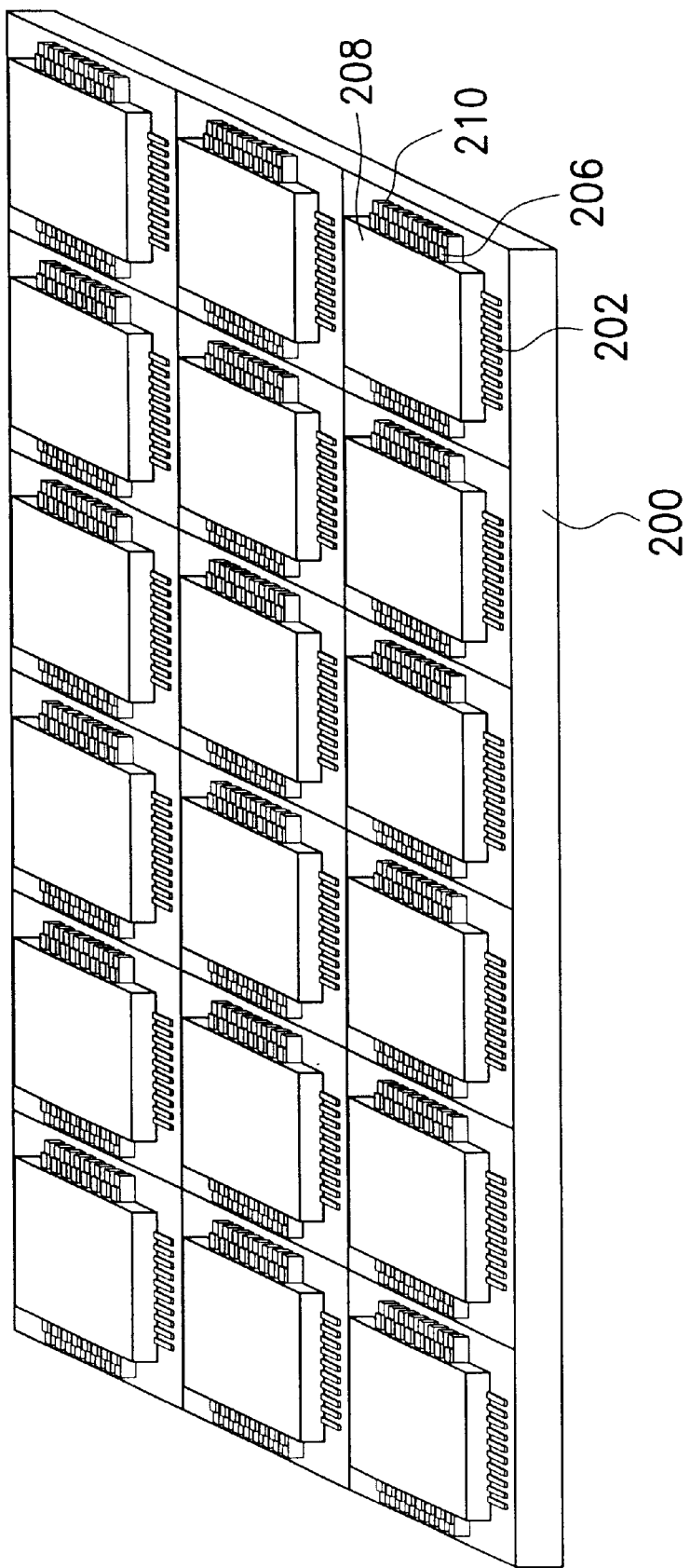

In FIG. 6, an encapsulation step is performed to wrap the hole transport layer 204a and organic luminescent layer 204b to isolate them from the penetration of oxygen and water molecules. The reliability of the device package is further enhanced.

According to the above, the method of fabricating an organic light emitting diode includes at least the following advantages:

1. A fluid is used to dissolve a part of the multi-layer structure including organic luminescent layer, hole transport layer, hole injection layer, electron transport layer, and electron injection layer, which is then removed by venting or vacuuming. The organic light emitting diode can thus be mass-produced automatically.

2. The fluid is sprayed from a nozzle to remove the multi-layer structure of organic luminescent layer, hole transport layer, hole injection layer, electron transport layer, and electron injection layer. In this way the fabrication cost is greatly reduced.

Other embodiments of the invention will appear to those skilled in the art from consideration of the specification and practice of the invention disclosed herein. It is intended that the specification and examples are to be considered as exemplary only, with a true scope and spirit of the invention being indicated by the following claims.

What is claimed is:

1. A method of fabricating an organic light emitting diode, comprising:

providing a transparent substrate;

forming a plurality of anodes on the substrate;

forming a plurality of organic material layers which includes a hole transport layer and an organic luminescent layer;

spraying a fluid from a nozzle to dissolve a portion of the organic material layers;

removing the dissolved organic material layers by venting or vacuuming, such that a plurality of regions of organic material layers is formed;

performing an encapsulation step on the regions of organic material layers to form a plurality of light emitting diodes; and performing a cutting step to form a plurality of light emitting diode dies.

2. The method according to claim 1, wherein the organic material layers further comprise a hole injection layer located between the anodes and the hole transport layer.

3. The method according to claim 1, wherein the organic material layers further comprise an electron transport layer on the organic luminescent layer.

4. The method according to claim 3, wherein the organic material layers further comprise an electron injection layer on the electron transport layer.

5. The method according to claim 1, wherein the fluid comprises a liquid that can dissolve the organic material layers.

6. The method according to claim 1, wherein the fluid comprises a gas that can dissolve the organic material layers.

7. A method of fabricating an organic light emitting diode, comprising at least:

providing a transparent substrate;

forming a plurality of anodes on the substrate;

forming organic material layers including a hole transport layer and an organic luminescent layer globally on the anodes;

patterning the organic material layers by removing the organic material layers by a fluid, so that a plurality of regions of the organic material layers is formed;

forming a cathode on each region of the organic material layers;

performing an encapsulation step on the regions of the organic material layers to form a plurality of light emitting diodes on the substrate; and performing a cutting step to separate the light emitting diodes.

8. The method according to claim 7, wherein the organic material layers further comprise a hole injection layer between the anode and hole transport layer.

9. The method according to claim 7, wherein the organic material layers further comprise an electron transport layer between the cathode and the organic luminescent layer.

10. The method according to claim 9, wherein the organic material layers further comprise an electron injection layer between the electron transport layer and the cathode.

11. The method according to claim 7, wherein the fluid comprises a liquid that can dissolve the organic material layers.

12. The method according to claim 7, wherein the fluid comprises a gas that can dissolve the organic material layers.

13. The method according to claim 7, wherein the dissolved organic material layers are removed by a venting system.

14. A method of fabricating an organic light emitting diode, comprising at least the steps of:

providing a transparent substrate;

forming a plurality of anodes on the substrate;

forming an organic material layer including at least an organic luminescent layer globally on the anodes;

patterning the organic material layer by dissolving the organic material layer with a fluid, so that a plurality of regions of the organic material layer is formed;

forming a cathode on each region of the organic material layer;

performing an encapsulation layer on the regions of the organic material layers to form a plurality of light emitting diodes on the substrate; and performing a cutting step to separate the light emitting diodes.

15. The method according to claim 14, wherein the organic material layer further comprises a hole transport layer between the organic luminescent layer and the anodes.

16. The method according to claim 15, wherein the organic material layer further comprises a hole injection layer between the anodes and hole transport layer.

17. The method according to claim 14, wherein the organic material layer further comprises an electron transport layer between the cathodes and the organic luminescent layer.

18. The method according to claim 17, wherein the organic material layer further comprises an electron injection layer between the electron transport layer and the cathodes.

19. The method according to claim 14, wherein the fluid comprises a liquid sprayed from a nozzle that can dissolve the organic material layer.

20. The method according to claim 14, wherein the fluid comprises a gas sprayed from a nozzle that can dissolve the organic material layers.

21. The method according to claim 14, wherein the dissolved organic material layer is removed by a venting system.

* * * * *